United States Patent [19]

Herning et al.

[11] 4,396,459
[45] Aug. 2, 1983

[54] METHOD AND SOLUTION FOR ETCHING INDIUM ANTIMONIDE

[75] Inventors: Paul E. Herning, Goleta; Edward Y. Sutcliffe, Santa Barbara, both of Calif.

[73] Assignee: The United States of America as represented by the Secretary of the Air Force, Washington, D.C.

[21] Appl. No.: 418,886

[22] Filed: Sep. 16, 1982

[51] Int. Cl.³ .................. H01L 21/306; C03C 15/00; C03C 25/06
[52] U.S. Cl. .................................. 156/647; 156/626; 156/651; 156/654; 252/79.1
[58] Field of Search ............... 156/647, 654, 662, 626, 156/645, 651; 252/79.1, 79.4

[56] References Cited

U.S. PATENT DOCUMENTS 3,143,447  8/1964  Norr .................................... 156/17

OTHER PUBLICATIONS

Compound Semiconductors, vol. 1, Preparation of III-V Compounds, Rheinhold 1963, QCI, J82, pp. 445-468, Etching of the III-V Intermetallic Compounds, by J. W. Faust, Jr.

Primary Examiner—William A. Powell
Attorney, Agent, or Firm—Donald J. Singer; William J. O'Brien

[57]   ABSTRACT

A method for delineating defects in the $<\bar{1}\bar{1}\bar{1}>$ surface of an indium antimonide crystal wafer by treating said surface with a 5 percent solution of iodine in N,N-dimethylacetamide to form triangularly shaped etch pits in the defect area.

5 Claims, 2 Drawing Figures

METHOD AND SOLUTION FOR ETCHING INDIUM ANTIMONIDE

STATEMENT OF GOVERNMENT INTEREST

The invention described herein may be manufactured and used by or for the Government for governmental purposes without the payment of any royalty thereon.

BACKGROUND OF THE INVENTION

This invention relates in general to a system for delineating defects in the surface structure of a crystalline material. The delineated defects can then be used as a measure of crystalline perfection of the material. In a more particular aspect, this invention concerns itself with a method for statically etching the $<\overline{111}>$ face of an indium antimonide crystal and to an etchant solution for use therewith.

The increased use of infrared sensors for a variety of military and industrial applications has generated a considerable research effort in the development of integrated focal plane arrays for use in the infrared sensors. The use of these arrays provides a dual advantage in that they not only improve sensor performance efficiencies, but, in addition, reduce weight volume and power requirements for associated subsystems. One type of focal plane array which has achieved optimum utilization are the charge coupled infrared imaging devices (CCIRID) which combine monolithic detector elements and charge transfer devices for use in multiplexing or other signal processing functions in a common infrared semiconductor material. Other applications of monolithic infrared CCD's include their use as sensors for earth resource management techniques in agriculture, geology, and coastal zone management; IR astronomy; and meteorological observations from space. Accordingly, the development and generation of new concepts in monolithic infrared imaging has become an important research objective.

The semiconductor material found to be most effective in attempts at accomplishing the research objective referred to above is indium antimonide (InSb). This material is especially useful for CCIRID devices with a photon detection capability in the one to 5.5 $\mu$m spectral region. The InSb crystals, however, must be free, or substantially free from surface defects in order to perform at maximum efficiency. A number of methods have been suggested and relied upon in attempting to provide InSb crystals substantially free from crystal lattice defects on the $<\overline{111}>$ face of the crystal. For example, InSb crystals can be grown by conventional liquid phase epitaxy (LPE) techniques, or by resorting to the well known Czochralski crystal pulling technique (CZ). Significant differences in MOS storage times and leakage currents are often observed in implanted p-n junctions when fabricated on CZ grown InSb wafers as opposed to LPE grown crystals, with both characteristics being found superior for the LPE layers. The electrical difference seems to be correlated, at least in theory, with surface defects observed in the CZ grown InSb wafers but that are totally absent from the LPE grown InSb layers.

As a consequence, the development of an etchant solution capable of detecting defects in the surface structure of an InSb semiconductor material became of paramount importance to the research program's efforts to accomplish its objectives. The purpose of the etchant, of course, is to delineate any defects on the $<\overline{111}>$ surface of the InSb semiconductor material. The number of defects per unit area provides a measure of crystalline perfection of the semiconductor and an indication of its quality and potential for utilization in the monolithic infrared CCD linear imaging arrays presently being used for a variety of military and industrial applications. Obviously, it is advantageous to select the least defective material in order to ensure that the solid state devices using InSb crystals operate with the highest degree of efficiency.

The preparation of InSb substrates for device fabrication involves polishing processes which, if not carefully controlled, may introduce damage. This damage propagates into the bulk of the substrate to some depth and causes defects which must be removed by chemical polishing prior to device fabrication.

Defect densities are often characterized by the use of etches which delineate crystal lattice defects. Many defect etches exist which delineate crystal lattice defects on the $<111>$ (metal rich) face of InSb substrates. However, the $<\overline{111}>$ (semi metal rich) face is the one commonly used for device fabrication. Prior to this disclosure, the defect density for a prospective device quality substrate was determined for the $<111>$ face and assumed to be the same for the opposite $<\overline{111}>$ face. The etchant of this invention however allows for the defect density of a substrate to be determined for the surface on which devices are fabricated, thus eliminating the ambiguity of the previous method.

With the present invention, it has been found that the research objectives referred to above, as well as the facile selection of crystalline material relatively free of surface defects, can be accomplished by using an iodine solution of N,N-dimethylacetamide to statically etch the surfaces of the crystalline material. Etching the crystal surface results in the formation of triangular shaped etch pits that are due to crystal lattice defects. A microscopic examination of the etched surface can then be conducted in order to determine which crystalline material is least defective in order to ensure the best performance for solid state devices using such crystals.

SUMMARY OF THE INVENTION

The present invention concerns itself with a reliable, efficient and economical method for delineating defects in the surfaces of indium antimonide crystals. In carrying out the method of this invention, an etchant solution comprising a five percent solution of iodine in N,N-dimethylacetamide is utilized to statically etch the $<\overline{111}>$ surface of an indium antimonide (InSb) crystal. The indium antimonide (InSb) crystal is immersed in the solution for a period of about 20 minutes, resulting in the creation of triangularly shaped etch pit for each crystal lattice defect present in the surface of the crystal. Examination using a microscope, such as a scanning electron microscope (SEM) for example, reveals the etch pits which can then be relied upon as a measure of crystal perfection.

Accordingly, the primary object of this invention is to provide a simple, realiable, efficient and economical method for delineating crystal lattice defects in the surfaces of indium antimonide crystals.

Another object of this invention is to provide a reliable method for determining the degree of perfection of indium antimonide crystals.

A further object of this invention is to provide a simple and efficient method for etching the $<111>$ surface of an indium antimonide crystal and a novel etching solution for use therewith.

The above and still further objects and advantages of the present invention will become more readily apparent upon consideration of the following detailed description thereof when viewed in conjunction with the accompanying drawings wherein like reference numerals refer to the same or similar elements.

DESCRIPTION OF THE PREFERRED EMBODIMENT

Pursuant to the above-defined objects, the present invention concerns itself with a method for etching the $<\overline{111}>$ surface of an indium antimonide crystal as a means for delineating crystal lattice defects in the surface thus ascertaining the degree of perfection of the crystal for potential use in solid state devices.

The development and utilization of indium antimonide (InSb) CCD devices and basic InSb metal-oxide-semiconductors (MOS) has been materially enhanced through the use of the novel etching solution and etching method of this invention. Determining the amount and severity of the defects in the $<\overline{111}>$ face of InSb crystals permits the advantageous selection of the least defective material, thus ensuring that the selected crystal will provide the best performance characteristics for these solid state devices.

In growing InSb crystals in accordance with conventional crystallographic techniques, such as the Czochraski crystal pulling method (CZ), it was found that a change in quality occurred even though each pit density, mobility, and other specified parameters of the crystaline wafers were meeting specifications. At the same time, epitaxial InSb layers were being grown by LPE on the CZ wafers which, when impurity concentration and layer morphology were acceptable, provided relevant comparative data for quality control purposes. Significant differences in both MOS storage time and leakage currents of implanted Be p-n junctions were observed when fabricated on the LPE InSb layers versus the CZ InSb wafers on hand at that time, both characteristics being superior for the LPE layers.

Figure 1:
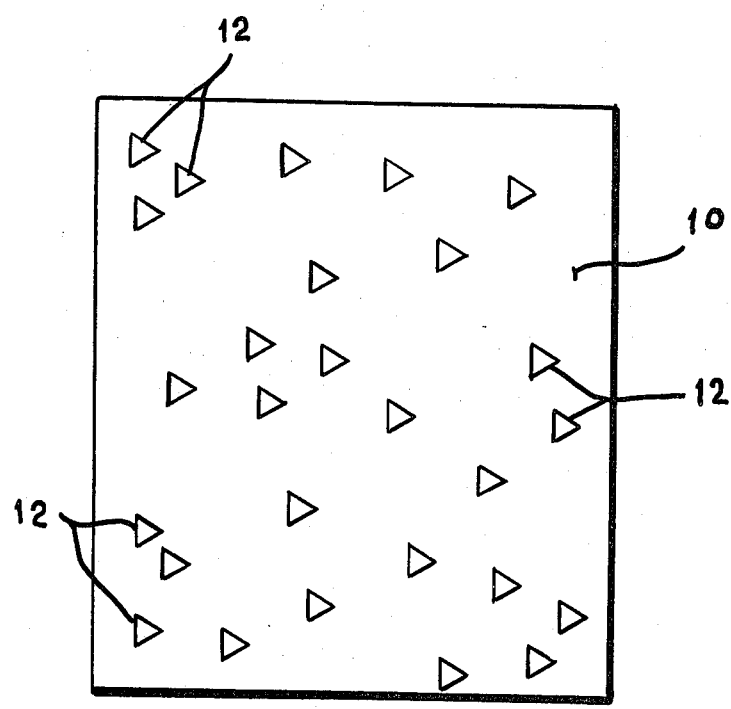
FIG. 1 represents a photomicrograph showing triangular shaped pits on the surface of an indium antimonide $<\overline{111}>$ single crystal substrate which has been etched in accordance with the method of this invention.
Figure 2:
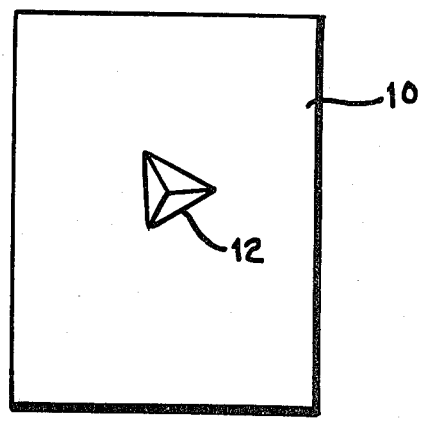
FIG. 2 represents a microphotograph showing in greater detail one of the etch pits illustrated in FIG. 1.

These electrical differences were correlated with defects observed in the CZ InSb wafers but were totally absent in the LPE InSb. A preferential etchant, therefore, was developed in accordance with this invention in order to provide the means for determining defects on the $<\overline{111}>$ face of the CZ wafers or epi layers. The results from defect etching a CZ InSb wafer of suspected quality are shown in FIGS. 1 and 2 of the drawings. FIG. 1 illustrates a phase contrast photomicrograph at 40× magnification of the surface area 10, of an indium antimonide crystal wafer with triangularly shaped etch pits randomly dispersed on the $<\overline{111}>$ face of the wafer. The triangularly shaped etch pits are produced in the $<\overline{111}>$ face after 20 minute etch with the etching solution of this invention and represent crystal lattice defects in the surface structure of the crystal. A large density of etch pits, up to several hundred per square centimeter, are observed. Before performing the defect etch, about 20 μm of material was removed from the surface of the CZ InSb wafer with a polish etch to ensure that the pits were not a surface phenomenon, i.e., due to residual polishing damage or from the encapsulating material used in shipment. The predominant source for the crystal lattice defects in the CZ material are thought to be chemical complexes, probably oxides, randomly included throughout the crystal. The density of these defects varies from ingot to ingot, and the wafer of Figure one probably represents a worst case. Pits revealed by the defect etch also can be due to other sources such as mechanical damage. For example, the lines of pits near the edge of the wafer visible in FIG. 1 are from handling work damage which occurred when it underwent the etch process. Performing the same defect etch on other wafers indicated that CZ ingots can be grown considerably more defect-free than that illustrated in FIG. 1, when greater care is exercised during crystal growth.

FIG. 2 illustrates a scanning electron microscope (SEM) at 700× magnification of a single etch pit found in the surface of the wafer of FIG. 1.

The etching solution of this invention is easily prepared for example, by dissolving 5 parts by weight of iodine with 95 parts by weight of N,N-dimethylacetamide. The surface of the crystal to be tested must be clean and fresh and, as a result, the surface is polish etched to ensure that the resulting etch pits are not a surface phenomena due to foreign contamination. When the polished surface is treated with the etching solution of the invention, the characteristic triangular pits will be formed in about 20 minutes at room temperature. Lower temperatures, of course, require longer etch times. After etching, the surface is washed with distilled water and dried. The surface is then observed microscopically and the number and severity of the pits are noted. As a result, quality selection of crystals having the best operational characteristics for solid state devices can be accomplished with simplicity and reliability.

While the principles of this invention have been described with particularity, it should be understood that various modifications and alterations can be made without departing from the spirit and of the invention, the scope of which is defined by the appended claims.

What is claimed is:

1. A solution for etching the $<\overline{111}>$ surface of an indium antimonide crystalline wafer comprising a mixture of iodine and N,N-dimethylacetamide.

2. A solution in accordance with claim 1 wherein said solution comprises about 5 parts by weight of iodine with the balance substantially all N,N-dimethylacetamide.

3. A method for delineating the crystal lattice defects in the $<\overline{111}>$ surface of an indium antimonide crystalline wafer which comprises the steps of treating said surface with a single solution comprised of a mixture of iodine and N,N-dimethylacetamide whereby triangularly shaped etch pits are formed to delineate areas of defect.

4. A method in accordance with claim 3 wherein said surface is treated for a period of about 20 minutes at room temperature.

5. A method in accordance with claim 4 wherein said mixture consists essentially of about 5 parts by weight iodine and the balance substantially all N,N-dimethylacetamide.

* * * * *